(12) United States Patent
Sklyarevich et al.

(10) Patent No.: US 11,621,168 B1
(45) Date of Patent: Apr. 4, 2023

(54) METHOD AND SYSTEM FOR DOPING SEMICONDUCTOR MATERIALS

(71) Applicant: Gyrotron Technology, Inc., Bensalem, PA (US)

(72) Inventors: Vladislav Sklyarevich, Bensalem, PA (US); Mykhaylo Shevelev, Huntingdon Valley, PA (US)

(73) Assignee: Gyrotron Technology, Inc., Bensalem, PA (US)

( * ) Notice: Subject to any disclaimer, the term of this patent is extended or adjusted under 35 U.S.C. 154(b) by 0 days.

(21) Appl. No.: 17/863,377

(22) Filed: Jul. 12, 2022

(51) Int. Cl.
| | |
|---|---|
| *H01L 21/268* | (2006.01) |
| *H01L 21/225* | (2006.01) |
| *H05B 6/80* | (2006.01) |
| *F27B 17/00* | (2006.01) |
| *F27D 11/12* | (2006.01) |
| *F27D 7/06* | (2006.01) |
| *F27D 9/00* | (2006.01) |
| *H05B 6/68* | (2006.01) |

(Continued)

(52) U.S. Cl.
CPC ...... *H01L 21/2255* (2013.01); *F27B 17/0025* (2013.01); *F27D 5/0037* (2013.01); *F27D 7/06* (2013.01); *F27D 9/00* (2013.01); *F27D 11/12* (2013.01); *H05B 6/645* (2013.01); *H05B 6/68* (2013.01); *H05B 6/78* (2013.01); *H05B 6/80* (2013.01); *F27D 2007/063* (2013.01); *F27D 2007/066* (2013.01); *F27D 2009/0075* (2013.01); *H01L 21/68764* (2013.01)

(58) Field of Classification Search
CPC ... H01L 21/22; H01L 21/2225; H01L 21/225; H01L 21/268

See application file for complete search history.

(56) References Cited

U.S. PATENT DOCUMENTS

| | | |
|---|---|---|
| 4,124,417 A | 11/1978 | Sirot et al. |
| 5,294,557 A | 3/1994 | Moore et al. |

(Continued)

OTHER PUBLICATIONS

P. Chenevier, J. Cohen & G. Kamarinos, "Pulsed annealing of semiconductors by microwave energy" J. Physique—Lettres vol. 42, pp. L-291-L-294 (Apr. 15, 1982).

(Continued)

*Primary Examiner* — Jae Lee
(74) *Attorney, Agent, or Firm* — Franklin Schellenberg

(57) ABSTRACT

A method and system for doping semiconductor materials using microwave exposure. In some embodiments, the surface of a semiconductor substrate coated with a layer of dopant material is exposed to a beam of microwave radiation, with the frequency of the microwave radiation chosen to coincide with a microwave absorption resonance of the dopant. A gyrotron is a preferred source of monochromatic microwaves capable of delivering the appropriate the power density. Under this microwave exposure, the dopant heats up and diffuses into the semiconductor. Since only the dopant is selectively excited, the atoms of the crystal lattice remain cooler. Additional cooling can be provided by a flow of cooling gas onto the surface. When the electric field of the microwave exposure is high enough to overcome the potential barrier of interstitial diffusion within the crystal, the dopants migrate to vacancies in the crystal lattice, and the semiconductor material becomes activated.

20 Claims, 5 Drawing Sheets

(51) Int. Cl.
  *H05B 6/64* (2006.01)
  *F27D 5/00* (2006.01)
  *H05B 6/78* (2006.01)
  *H01L 21/687* (2006.01)

(56) References Cited

U.S. PATENT DOCUMENTS

| | | |
|---|---|---|
| 5,395,794 A | 3/1995 | Sklyarevich et al. |
| 6,153,920 A | 11/2000 | Gossmann et al. |
| 6,368,994 B1 | 4/2002 | Sklyarevich |
| 6,408,649 B1 | 6/2002 | Sklyarevich et al. |
| 6,423,605 B1 | 7/2002 | Sklyarevich et al. |
| 6,424,090 B1 | 7/2002 | Sklyarevich |
| 6,429,102 B1 | 8/2002 | Tsai et al. |
| 6,849,831 B2 | 2/2005 | Timans et al. |
| 6,951,996 B2 | 10/2005 | Timans et al. |
| 7,063,760 B2 | 6/2006 | Sklyarevich et al. |
| 7,344,613 B2 | 3/2008 | Sklyarevich et al. |
| 7,476,284 B2 | 1/2009 | Sklyarevich et al. |
| 7,928,021 B2 | 4/2011 | Kowalski et al. |
| 7,968,383 B2 | 6/2011 | Honda et al. |
| 8,837,923 B2 | 9/2014 | Timans et al. |
| 8,866,271 B2 | 10/2014 | Yamamoto et al. |
| 8,987,645 B2 | 3/2015 | Ogawa et al. |
| 9,012,315 B2 | 4/2015 | Tsai et al. |
| 9,029,247 B2 | 5/2015 | Suguro |
| 9,171,724 B2 | 10/2015 | Yashima et al. |
| 9,214,430 B2 | 12/2015 | Funakoshi |
| 9,338,834 B2 | 5/2016 | Tsai et al. |
| 9,496,348 B2 | 11/2016 | Agraffeil |
| 9,505,654 B2 | 11/2016 | Sklyarevich et al. |
| 9,646,862 B2 | 5/2017 | Hamano et al. |
| 9,659,775 B2 | 5/2017 | Ikeda et al. |
| 11,292,161 B1 | 4/2022 | Sklyarevich et al. |
| 2003/0037570 A1 | 2/2003 | Sklyarevich et al. |
| 2005/0221017 A1 | 10/2005 | Sklyarevich et al. |
| 2006/0144522 A1 | 7/2006 | Sklyarevich et al. |
| 2006/0185395 A1 | 8/2006 | Sklyarevich et al. |
| 2006/0231190 A1 | 10/2006 | Sklyarevich et al. |
| 2006/0266956 A1 | 11/2006 | Sklyarevich et al. |
| 2007/0034317 A1 | 2/2007 | Sklyarevich et al. |
| 2007/0045298 A1 | 3/2007 | Sklyarevich et al. |
| 2007/0141817 A1 | 6/2007 | Lojek et al. |
| 2008/0236199 A1 | 10/2008 | Sklyarevich et al. |
| 2009/0078370 A1 | 3/2009 | Sklyarevich et al. |
| 2010/0055881 A1 | 3/2010 | Shimizu |
| 2011/0073589 A1 | 3/2011 | Shimizu |
| 2013/0072034 A1 | 3/2013 | Yashima et al. |
| 2015/0284283 A1 | 10/2015 | Sklyarevich et al. |
| 2015/0289316 A1 | 10/2015 | Shimizu et al. |
| 2016/0159678 A1 | 6/2016 | Sklyarevich et al. |
| 2016/0329331 A1 | 11/2016 | Tsai et al. |
| 2018/0025912 A1* | 1/2018 | Ikegami .............. H01L 21/2254 438/57 |
| 2019/0319150 A1* | 10/2019 | Loper ................. H01L 31/1868 |

OTHER PUBLICATIONS

A.A. Belyaev et al. "Effect of Microwave Treatment on the Bulk and Near-Contact Properties of Semiconductors of Technical Importance", Mat. Res. Soc. Symp. Proc. vol. 430, pp. 471-476 (1996).

A.A. Belyaev et al. "Influence of microwave treatment on the electrophysical characteristics of technically important semiconductors and surface-barrier structures", Technical Physics vol. 43(12), pp. 1445-1449 (Dec. 1998).

P. Kohli et al., "Microwave Annealing for Ultra-Shallow Junction Formation" Journal of Electronic Materials, vol. 31, No. 3 pp. 214-219 (2002).

T.L. Alford et al., "Variable Frequency Microwave Induced Low Temperature Dopant Activation in Ion Implanted Silicon"; in 17th IEEE Conference on Advanced Thermal Processing of Semiconductors, RTP 2009 (Published Dec. 1, 2009).

H. Tezuka et al., "Electron paramagnetic resonance of boron acceptors in isotopically purified silicon" Physical Review B, vol. 81, 161203(R) (published Apr. 19, 2010).

K. Hogan et al., "Novel Gyrotron Beam Annealing Method for Mg-Implanted Bulk GaN" in 2019 IEEE International Reliability Physics Symposium (IRPS), pp. 1-6 (published May 23, 2019).

V. Meyers et al., "P-type conductivity and suppression of green luminescence in Mg/N co-implanted GaN by gyrotron microwave annealing", J. Appl. Phys. 130, 085704 (published Aug. 27, 2021).

* cited by examiner

METHOD AND SYSTEM FOR DOPING SEMICONDUCTOR MATERIALS

CROSS-REFERENCE TO RELATED APPLICATIONS

None

FIELD OF THE INVENTION

The invention disclosed in this Application relates to the doping of semiconductor materials, and in particular, activating semiconductors used in the fabrication of integrated circuits.

BACKGROUND OF THE INVENTION

Semiconductor devices, such as integrated circuits, are formed in semiconductor materials using the selective introduction of dopant atoms, such as boron and phosphorous, into the lattice of the semiconductor lattice. When dopants take the place of semiconductor atoms in the semiconductor lattice, a process called "activation", the electrical properties of these regions are altered, forming, for example in silicon, n-doped (negative-doped) regions using phosphorus, and p-doped (with positive ions) regions using boron. Junctions between n- and p-doped regions form the basis for many semiconductor devices, such as diodes and bipolar transistors, and p-doped semiconductor substrates are commonly used in the fabrication of circuits using other transistor designs.

The most common method for doping semiconductors is ion implantation followed by annealing. This is illustrated in FIGS. 1A-1C. In ion implantation, charged dopant ions $11a$ are accelerated in an electric field and collide with the crystal semiconductor substrate $10a$, as shown in FIG. 1A. The accelerated dopant ions $11a$ penetrate the semiconductor substrate $10a$ and lodge themselves into interstitial sites within the semiconductor material.

After ion implantation, as shown in FIG. 1B, the implanted dopants $11b$ are located wherever they came to rest within the material, and the semiconductor substrate $10b$ is now altered, and can have considerable damage caused by the collisions with the energetic ions. Therefore, after implantation, a subsequent annealing process is typically applied. Annealing involves heating the entire implanted wafer to high temperatures (e.g. 900 to 1100° C.). The additional thermal energy allows dopants to migrate to substitutional locations within the semiconductor crystal lattice, where, once the wafer cools, they now are considered "activated" dopants $11c$, as shown in FIG. 1C.

This annealing process also allows displaced atoms of the crystal lattice to migrate to positions in the nodes of the crystal lattice, thereby forming a substrate $10c$ with the damage from ion implantation partially "healed". However, this "healing" may still have substantial damage, and the global thermal treatment can also cause undesired diffusion of the embedded dopants deeper within the semiconductor material, degrading the desired electrical properties.

Other processes to insert dopants into semiconductors involve diffusion alone. The semiconductor material is coated with the desired dopant, and then the entire wafer heated to allow diffusion from the surface into the semiconductor material. This can cause less damage than the energetic bombardment with accelerated ions, but still involves a global heating process. Furthermore, all dopants migrate from the surface, which can create uneven depth profiles. Creating a desired dopant penetration and profile can take considerably more time and require detailed process control.

There is therefore a need for process to allow introduction of dopants in semiconductors that better achieves the desired dopant profile for activation within the semiconductor, while minimizing damage and unwanted diffusion.

BRIEF SUMMARY OF THE INVENTION

The embodiments of the invention herein disclosed relate to a system and method for doping of semiconductor materials using microwave exposure. In some embodiments, the process begins with a semiconductor substrate (typically planar) coated with a layer of dopant precursor material, such as boron oxide ($B_2O_3$) as a source of boron (B) dopants. Then, this surface is exposed to a beam of microwave radiation, with the frequency and bandwidth of the microwave beam chosen to coincide with a microwave absorption resonance of the dopant material. A gyrotron is a preferred source of monochromatic microwaves capable of delivering the power density for this process, which is typically in the range of 100-1000 $W/cm^2$.

Under this exposure, the dopant heats up and diffuses into the semiconductor. The microwave exposure only selectively excites the dopant, so the atoms of the crystal lattice remain cooler. When the electric field of the microwave exposure is high enough to overcome the potential barrier of interstitial diffusion within the crystal, the dopants migrate into the semiconductor. In some embodiments, a single exposure may be sufficient to result in dopant atoms migrating into the vacancies in the crystal lattice, and the semiconductor material becomes activated with just one exposure. In some embodiments, a second exposure with a higher power density (selected to overcome the potential barrier for activation) may be provided after the first exposure is completed to ensure activation is achieved.

In some embodiments, the beam of microwaves is provided by a gyrotron focused onto the semiconductor material using a microwave optical system. In some embodiments, the microwave beam profile is a Gaussian beam. In some embodiments, the microwave beam uses a continuous wave beam to expose the semiconductor material. In some embodiments, the microwave beam uses pulsed intensity to expose the semiconductor material. In some embodiments, the microwave power density at the dopant/semiconductor interface is in the range of 100-1000 $W/cm^2$. In some embodiments, the electric field from the microwave exposure at the dopant/semiconductor interface exceeds 1 kV/cm, and is substantially parallel to a planar surface of the semiconductor material.

In some embodiments, a mount is used to hold the semiconductor material and the position of the mount is scanned, to expose an area larger than a single focused microwave spot. In some embodiments, the exposure process may take place in a vacuum. In some embodiments, the exposure process may take place under ambient atmospheric conditions. In some embodiments, the exposure process may take place in a high pressure atmosphere.

In some embodiments, additional cooling for the substrate can be provided by a flow of cooling gas onto the surface during exposure. In some embodiments, the mount holding the semiconductor material may be provided with a heat sink, such as a mass of conducting metal, to draw heat away from the semiconductor material. In some embodiments, a microwave transparent quartz layer above the material comprising dopant may be used to carry excess heat away from the semiconductor material. In some embodiments, the cooling gas may be one or more of nitrogen, carbon dioxide, inert noble gasses, or air.

DETAILED DESCRIPTIONS OF EMBODIMENTS

I. Embodiments of the Invention

Figure 1A:
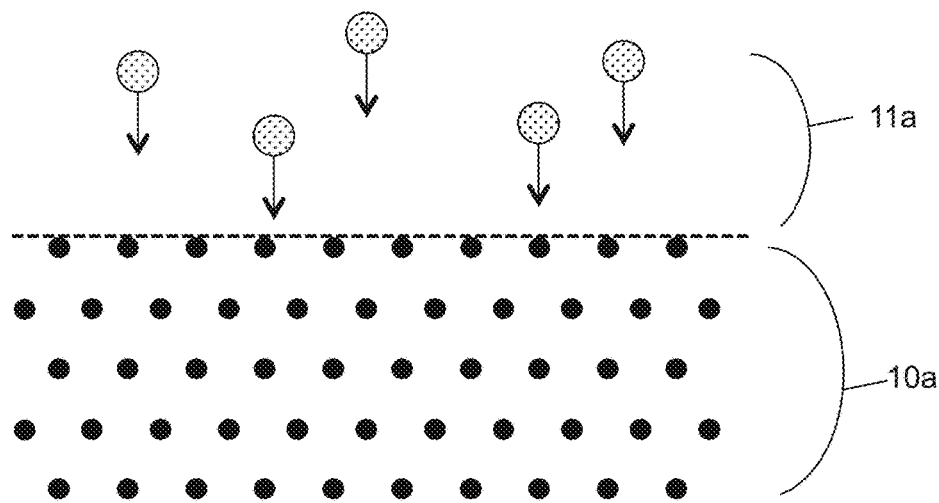
FIG. 1A illustrates a layer of semiconductor material being bombarded by dopant ions for a prior art ion implantation process.
Figure 1B:
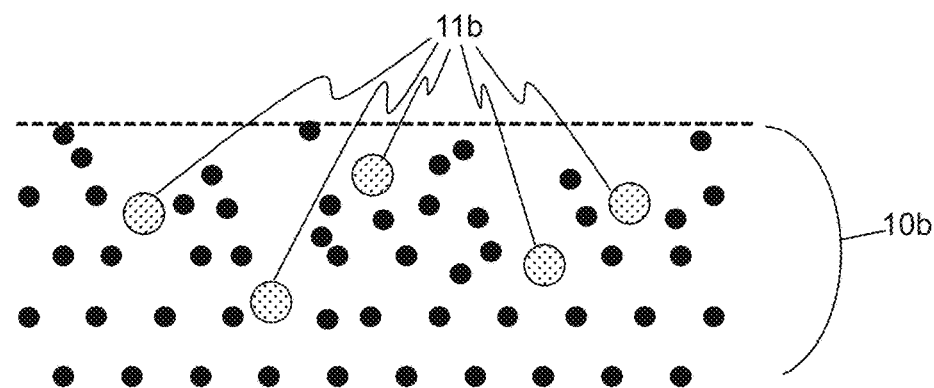
FIG. 1B illustrates the semiconductor material of FIG. 1A after ion implantation for a prior art ion implantation process.
Figure 1C:
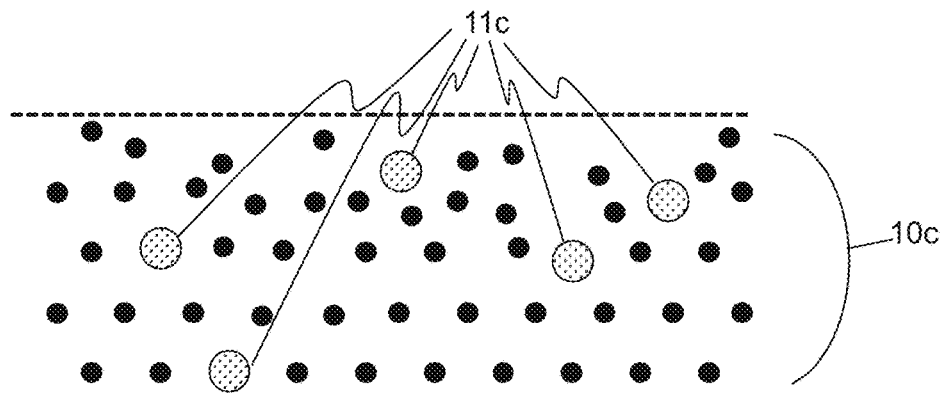
FIG. 1C illustrates the semiconductor material of FIG. 1B after subsequent annealing for a prior art ion implantation process.

Before describing in detail embodiments in accordance with the invention, it should be noted that the embodiments reside primarily in combinations of method step and system components related to facilitating the invention. Accordingly the method steps and components have been represented where appropriate by conventional symbols in the drawings showing only those specific details that are pertinent to understanding the embodiments of the present invention, so as not to obscure the disclosure with details that will be readily apparent to those of ordinary skill in the art having the benefit of the description herein.

Unless defined otherwise, all technical and scientific terms used herein have the same meaning as commonly understood by one of ordinary skill in the art to which this invention belongs. Any methods and systems, similar or equivalent to those described herein, can also be used in the practice of the invention. Representative illustrative methods and embodiments of systems are also described in accordance with the aspects of the invention.

Figure 2A:
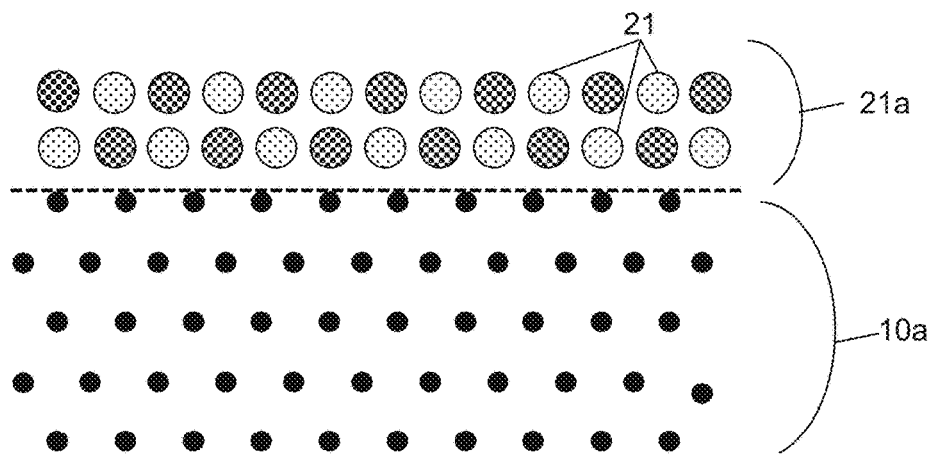
FIG. 2A illustrates a layer of semiconductor material having a coating comprising dopant ions, as used in an embodiment of the invention.
Figure 2B:
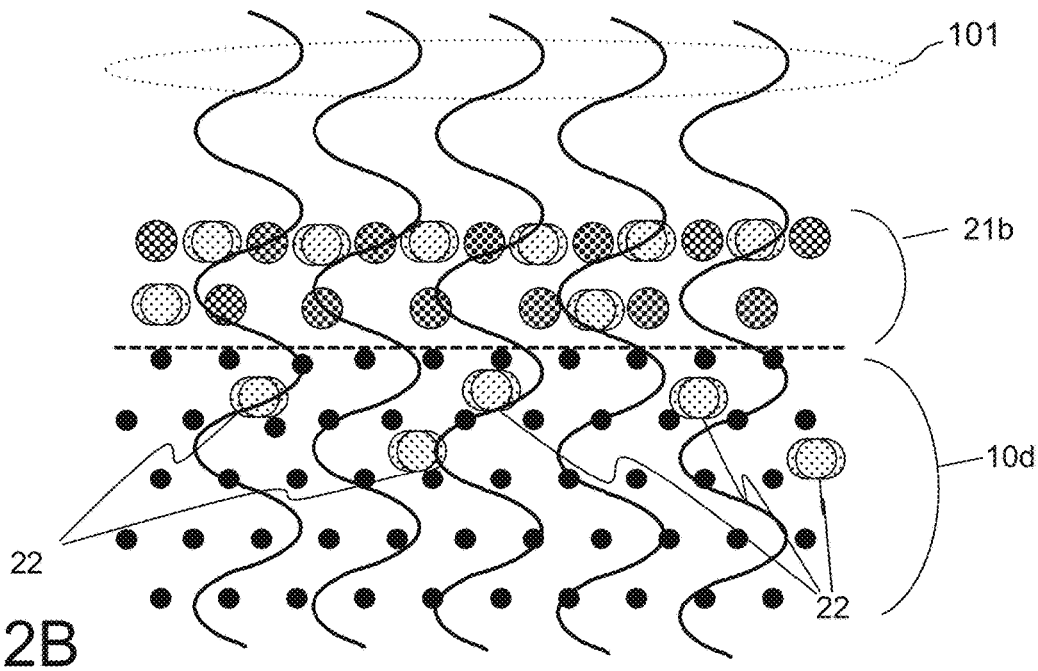
FIG. 2B illustrates the semiconductor material of FIG. 2A undergoing microwave exposure according to embodiments of the invention.
Figure 2C:
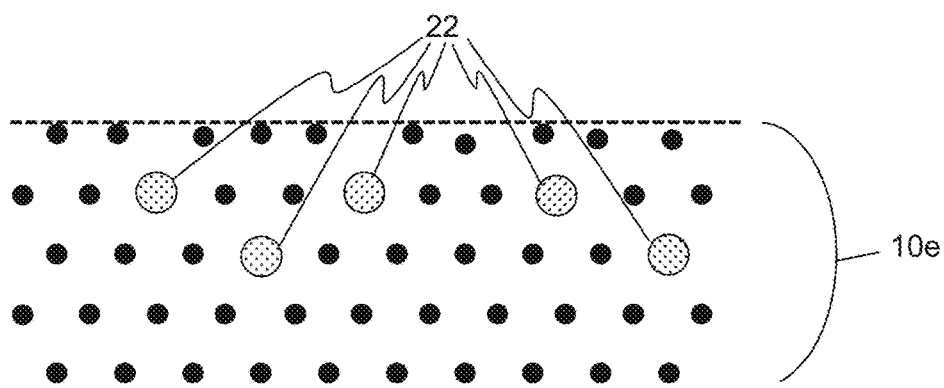
FIG. 2C illustrates the semiconductor material of FIG. 2B after microwave exposure according to embodiments of the invention.

The embodiments of the invention herein disclosed relate to the doping of semiconductor materials using microwave exposure. One embodiment of the invention is illustrated in FIGS. 2A-2C. As shown in FIG. 2A, the process begins with a semiconductor substrate 10a, typically a wafer such as a silicon wafer, upon which has been deposited a suitable layer 21a of material (such as boron oxide ($B_2O_3$)) comprising dopants 21, such as boron.

Then, as shown in FIG. 2B, this surface layer 21b is exposed to microwave radiation 101, with the frequency and bandwidth of the microwaves selected to coincide with a microwave absorption resonance of the dopant 21. Under this exposure, the dopant atoms absorb the microwave energy and heat up, and, driven by the dopant concentration gradient between the upper layer and the initial substrate, some of the dopant atoms 22 diffuse into the semiconductor. However, due to the resonance, the microwave energy is selectively transferred to the dopant atoms, so the atoms of the crystal lattice remain cooler. Although the diffusion process may create a somewhat altered semiconductor substrate 10d, with some atoms displaced by the transit of the excited dopant atoms 22, the extreme damage that can happen with ion implantation does not occur.

The microwave power density for this excitation is typically between 100 and 1000 W/cm$^2$. When the electric field of the microwave exposure is high enough to overcome the potential barrier of interstitial diffusion within the crystal, the dopants migrate to the vacancies in the crystal lattice. The remaining dopant material on the surface is then removed, and the semiconductor is considered "activated", resulting in a suitably doped semiconductor substrate 10e, as shown in FIG. 2C. In some embodiments, the exposure may be divided into two parts, with an initial exposure at one power density, and a second exposure with a higher power density (selected to overcome the potential barrier for activation) to ensure activation is achieved.

The process described above may be used for any number of semiconductors. Suitable semiconductor materials may be the ubiquitous silicon, for which boron is commonly used for forming p-doped silicon, and phosphorous is commonly used for forming n-doped silicon. Other semiconductor materials, however, may also be used for this processes using embodiments disclosed herein, such as germanium, silicon carbide, gallium nitride, gallium arsenide, indium gallium nitride, cadmium telluride, cadmium sulfide, and the like. The process may also be applied to materials other than semiconductors that require the insertion of dopants within their structures.

Dopants may be compounds such as boron, as mentioned above for forming p-doped silicon, or gallium and indium, for other p-doping uses in various processes. Dopants may be compounds such as phosphorous, as mentioned above for forming n-doped silicon, or arsenic, antimony, bismuth, and lithium for other n-doped uses in various processes. The process may also be applied to dopants other than those mentioned here that may be known to those skilled in the art.

Semiconductor wafers are typically planar, with flatness, warp, and bowing specifications measured in micrometers for a wafer several inches in diameter. A typical total thickness variation (TTV) for a 300 mm diameter silicon wafer can be 1 micron or smaller, so these wafers are manufactured to be essentially planar. However, individual wafers may have score lines, grooves, identifying markings, or even topography from previously executed process steps (e.g. the formation of a recessed oxide region), so a semiconductor wafer may have local deviations from planarity even though it is substantially planar overall. For the purposes of definition in this description, a portion of a semiconductor object is "substantially" planar if the variation in topography is less than 10 microns over a region 1 inch in diameter.

The microwave frequency is selected to correspond to an energy for which the dopant compound has a strong, resonant absorption. These frequencies correspond to natural vibrational modes of the dopant atom, and generally fall between the range of 28 GHz and 250 GHz, and are therefore in the microwave domain. Specific resonance frequencies for particular dopant atoms can be calculated using vibrational theoretical modeling, or measured using standard spectroscopy techniques.

The dopant material can be initially added to the surface of the substrate by any of a number of deposition processes, including sputtering, spraying, vacuum deposition, and the like. For a typical use, the dopant layer may be approximately 50 µm thick. Furthermore, the dopant material may be additionally protected by the subsequent deposition or placement of an additional cap layer above it. This cap layer may be a microwave-transparent material such as quartz, and may also have thermal properties that allow it to serve as a heat sink for energy deposited into the substrate, providing additional cooling.

In some embodiments, the dopant may be added to the layer using a selective pattering process, such as photolithography, to place dopants only on certain parts of the substrate.

To heat the dopant atoms preferentially, a microwave beam with both high energy and a monochromatic wavelength is preferred. Although any microwave source with the required properties could be used, one such source is the gyrotron. The gyrotron is a class of high-power linear-beam vacuum tubes that generates millimeter-wave electromagnetic waves by the cyclotron resonance of electrons in a strong magnetic field. Sometimes called a "free electron maser", these machines can generate highly monochromatic microwaves at powers ranging from 10 kW to 1 MW. Gyrotrons can be operated in both pulsed and continuous wave modes, allowing flexibility in determining the exposure parameters.

Figure 3:
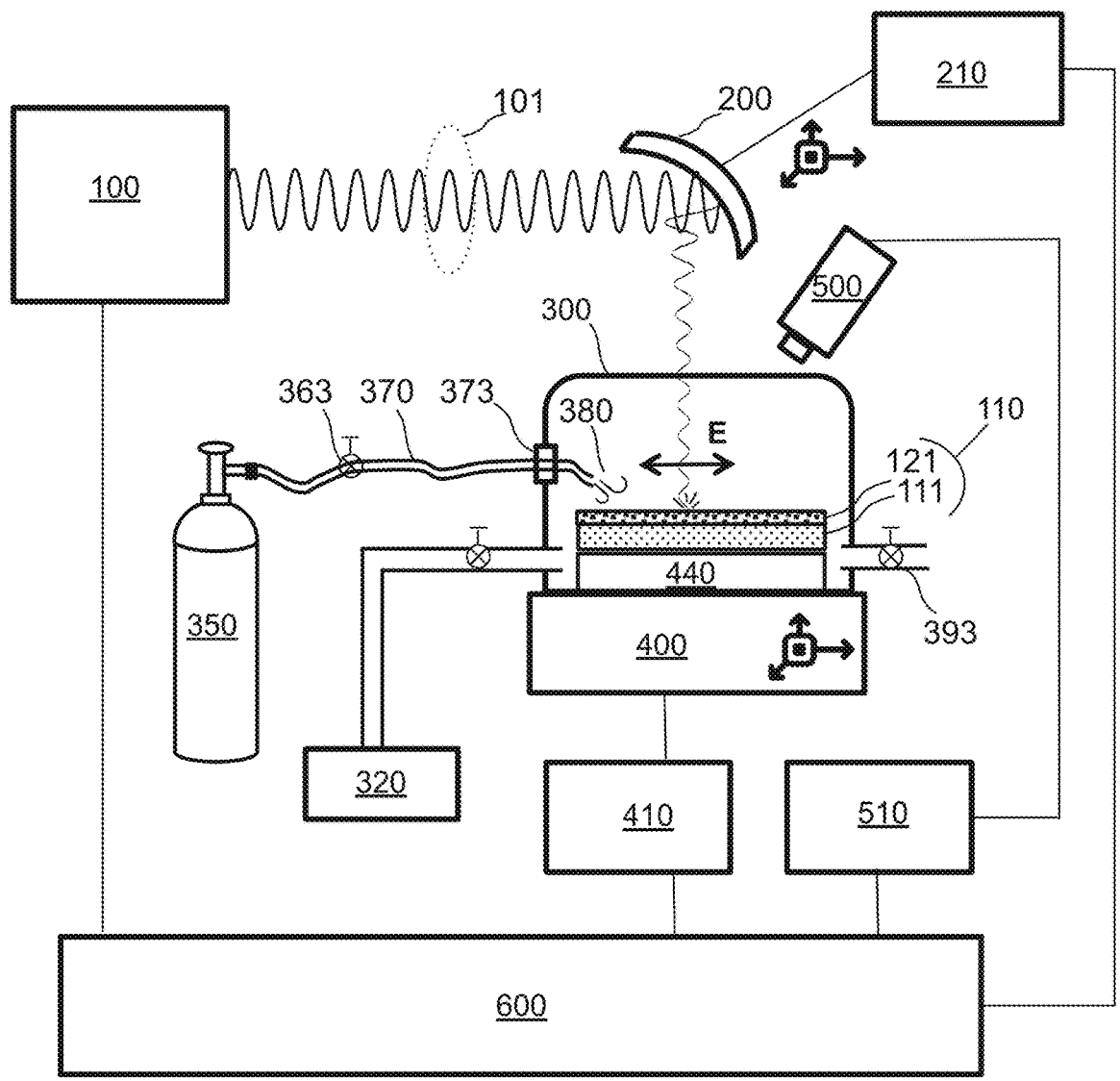
FIG. 3 illustrates a schematic of a system according to embodiments of the invention.

A system for exposing a substrate coated with a dopant according to some embodiments of the invention is illustrated in FIG. 3. An object 110 to be exposed has a substrate 111 upon which a dopant material 121 has been deposited, and is has been mounted in a processing chamber 300 on a stage 400. A microwave source 100 produces microwaves 101 that fall onto a reflective optical system 200. The optical system 200 may have one or several optical elements, and is configured to focus the microwaves onto a point in space coincident with the substrate 111 on the stage 400.

In some embodiments, the optical system 200 may comprise multiple reflective elements, with the final aperture of approximately 20 cm and a focal length of about 25 cm. In some embodiments, the gyrotron output is polarized, and the polarization is maintained through the optical system. In some embodiments, the polarization may be altered by the optical system. However, in a typical embodiment (i.e. when the substrate 111 is a semiconductor substrate that is substantially planar), the alignment is such that the electric field of the microwaves will be parallel to the plane of the substrate 111 during exposure. In some embodiments, the microwave optics may be attached to an optics controller 210 that can adjust the optical elements to steer the beam position over the object 110. In preferred embodiments, the controller 210 will adjust the beam so that the electric field of the microwaves remain substantially parallel to the surface of the object 110, although some designs may allow beam scanning at small angles that deviate from normal incidence (e.g. ±5 degrees) and may still be functional.

In this illustration, the chamber may be formed from a microwave transparent material, such as quartz. If a different material is used (e.g. stainless steel for a higher pressure applications), a microwave transparent window, made from quartz or boron nitride, may be provided for the chamber.

Additionally, the processing chamber 300 is equipped with a vacuum pump 320 to control the atmosphere within the processing chamber 300, and a gas tank 350 is connected by a hose 370 with a control valve 363 to the chamber 300 through a pass-through valve 373. At the end of the hose, gas 380 flows onto the object 110 during exposure. The chamber 300 is also equipped with a vent 393 to release gas from the chamber 300.

The flowing gas 380 can serve to provide cooling to the substrate as the dopants heat up under microwave exposure, and prevent additional diffusion of dopants deeper into the substrate. The source of gas 350 may also be used to set atmospheric conditions within the chamber 300 when desired. In other embodiments, a separate source of gas with an additional intake port (not illustrated) may be used to provide the ambient gas. In some embodiments, the Gas pressure may be varied to operate in a vacuum (e.g. less than 1 millibar) using the vacuum pump, at ambient atmospheric pressure (~1 bar), and up to pressures as high as 20 to 40 bar. When operating at high pressure, it may not be necessary to provide a flow of cooling gas as well, and a specially designed high pressure chamber may be employed.

Typical gases that can be used for cooling are air, nitrogen, carbon dioxide, or any of the noble gasses (e.g. helium, neon, argon, etc.). Although many gasses or combinations thereof may be used, it is highly desirable that any gas selected to provide cooling be relatively transparent to microwaves at the frequency selected for exposure of a particular dopant. Therefore, as the microwave frequency may be different depending on the dopant resonance frequency, so the gas selection may vary as well.

In addition to cooling by gas, the stage 400 may be additionally be provided with a mount 440 for the object 110 that may comprise a heat conducting pedestal that can serve as a heat sink, drawing heat away from the object 110 as it is exposed to microwaves 101. The pedestal may be a material such as stainless steel, or some other metal (such as aluminum) or a material (such as silicon carbide) chosen for high thermal conductivity.

The focused microwave beam as illustrated is smaller than the total area of the substrate 111. To accommodate this situation, the stage 400 may be equipped with translation motors that allow its position to be changed within the plane of the stage, scanning the substrate under the microwave beam to ensure full exposure. The stage 400 may also be equipped with height controls that allow the position of the substrate 111 to be adjusted to be coincident with the focal point of the microwaves as focused by the optical system 200. The translation states may be 3-axis controllers using stepper motors, or some combination of a rotary stage and a translations stage, depending on the areas that need to be controlled.

As shown in figure, the motions of the stage 400 may be controlled by a stage controller 410 that provides signals from outside the chamber 300 to the stage 400 inside the chamber 300. The control signals provided by the stage controller 410 may be by means of wires that pass through the wall of the chamber 300, or by using wireless signals.

Also shown in the figure is a pyrometer 500, aimed to at the point of exposure for microwaves on the substrate, to detect and monitor temperature during exposure. The electronic signals representing this temperature information from the pyrometer 500 may also be passed through the wall of the chamber 300, using wires or wirelessly, to a controller/display 510 to provide the temperature information to a user or other system controller 600.

In some embodiments, the information from the pyrometer 500 provided by the pyrometer controller/display 510 may be coordinated with stage motions governed by the stage controller 410 by a system controller 600. The system controller 600 in some embodiments may be configured to control both the microwave source 100 and the stage controller 410 and, in response to data from the pyrometer 500 through the pyrometer controller/display 510, manage microwave power, exposure dose, and stage position to ensure uniform exposure over large areas.

Figure 4:
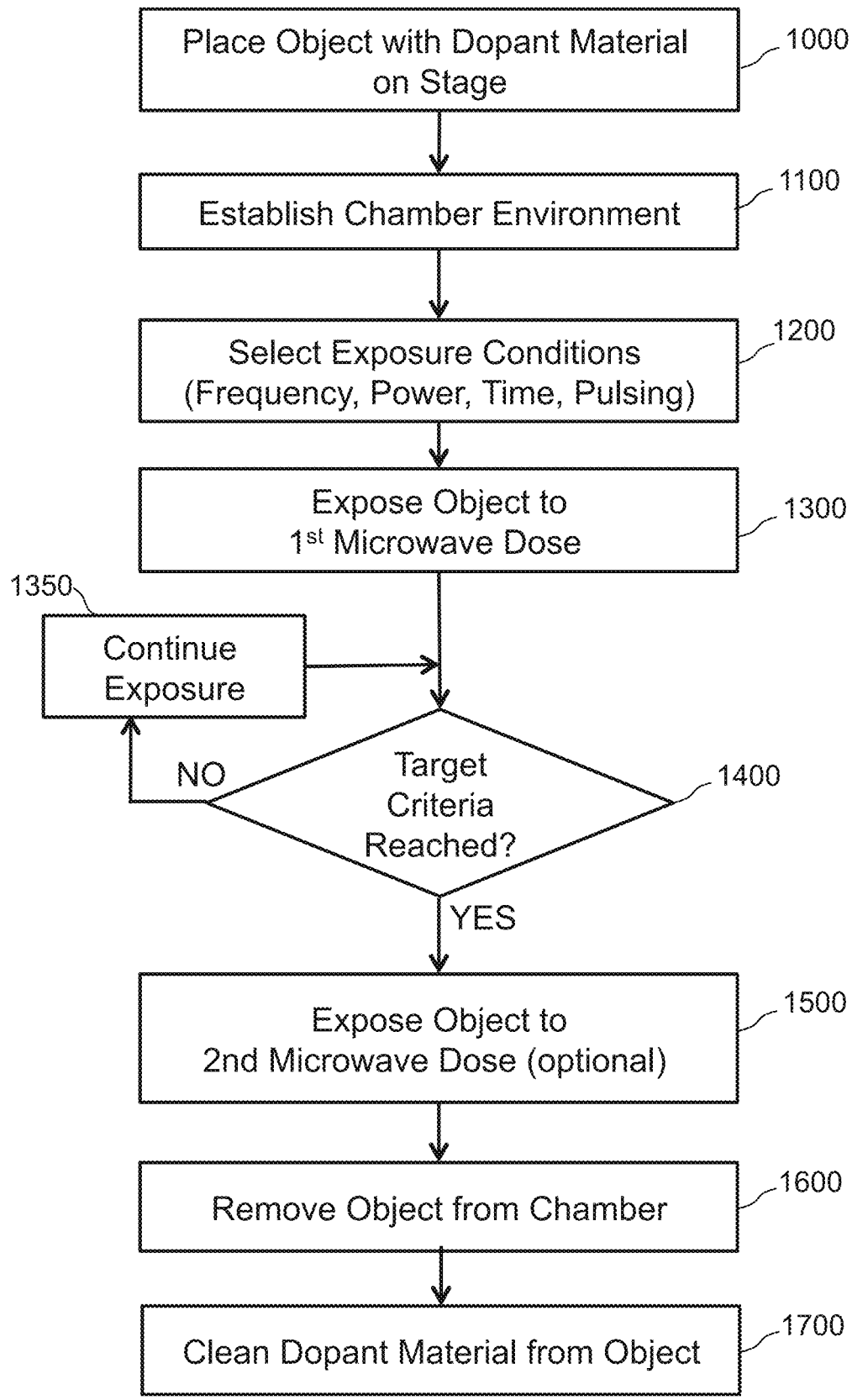
FIG. 4 illustrates a sequence of steps for a process flow that may be used in implementing some embodiments of the invention.

FIG. 4 provides a flow chart for a method for carrying out an exposure to microwaves as might be executed using the system shown in FIG. 3 according to an embodiment of the invention.

In the initial step 1000, an object to be exposed, such as a semiconductor wafer comprising a substrate and, in at least some part, a layer of dopant material, is mounted onto the stage.

In the next step 1100, the appropriate chamber environment is set. This may comprise sealing the chamber and using the vacuum pump to establish some degree of vacuum in the chamber, or it may be simply leaving the chamber filled with ambient air at standard temperatures and pressures. A gas tank may also be used to fill the chamber with a gas, such as air or nitrogen at a predetermined pressure deemed suitable for the process. In some embodiments, the pressure in the chamber may be a high pressure environment.

The selection of pressure will depend on the dopant and semiconductor combination, and for particular desired results, some customization of the process may be desired. As an example, doping boron into silicon using a nitrogen or helium environment at ~1 bar has been found to be effective. However, for doping magnesium into GaN, high pressures of ~40 bar have been found to be effective.

In the next step 1200, the conditions for microwave exposure are selected. This may be as simple as running a predetermined program, in which the substrate and dopant materials are entered, and the program automatically selects the appropriate microwave operating conditions, which may include microwave frequency, power level, exposure time, and whether to operate in pulsed mode. The appropriate program for stage motions may also be automatically generated at this point, so that, with the selected microwave conditions, the entire substrate is properly exposed.

Although it is generally envisioned that a system executing these processes would operate under some degree of automation, the selections of this step may also be made by a human operator, without automatic control.

In the next step 1300, the wafer stage is aligned to its starting position, and the microwaves turned on to expose the dopant-coated substrate. The initial exposure dose may simply be a timed exposure, or the power and duration of the exposure may be adjusted based on concurrent measurements provided by a pyrometer. The microwave source may be operated in a continuous wave mode, or in a pulsed mode. Operating in a pulsed mode allows some heat dissipation in the substrate to occur, minimizing the likelihood of negative thermal effects due to the lattice itself heating up.

In the next step 1400, the system constantly checks whether exposure target criteria have been met. These may simply comprise meeting the required exposure dose (a combination of power and time), or determining whether a predetermined temperature at the spot of exposure has been reached for some duration of time. In some embodiments, the exposure will be set such that the electric field intensity of the microwaves overcomes the potential barrier of interstitial diffusion of the said dopants, and the end point of the exposure is calibrated to be set at the point when the majority of the diffused dopants are lodged in nodes of the crystal lattice.

In any case, if the target criteria have not yet been met, the step 1350 is executed, in which the exposure continues, until step 1400 indicates that the target criterion has been met.

Once the initial criteria for the initial exposure have been met, the system changes conditions to a second criterion. In this step 1500, the microwave dose is adjusted not to excite the dopant atoms to be driven into the substrate by means of a concentration gradient, but to drive the embedded dopant atoms to find substitutional placement at nodes within the crystal lattice of the substrate. This typically involves a dose with a higher power (e.g. higher electric field). For some dopants and some substrates, the result of the initial exposure may achieve the desired placement of dopants into substitutional positions within the crystal lattice, and so once the target criteria are met, a second exposure may not be required. This second exposure may therefore be optional. If it is used, however, the second exposure step 1500 may also take place while flowing cooling gas over the surface, to ensure only the dopant atoms are excited, and the crystal lattice is not significantly heated For some situations where the size of the microwave beam is smaller than the entire semiconductor substrate, the initial exposure may be carried out initially throughout the entire substrate, with the stage moving systematically to expose the entire wafer to the initial microwave dose before returning the stage to the initial position, and then exposing the entire wafer using the second microwave dose. In some embodiments, the stage may remain in a single position for both the first and second microwave exposures, and then move to a second position to then expose the second position to the first microwave dose, followed by the second microwave dose, and so on through out the positions within the wafer.

When the entire region of the substrate requiring exposure has been properly exposed, in the next step 1600, the process ends, and after restoring the chamber environment to ambient conditions, the object, now comprising a doped substrate, is removed from the chamber.

In most cases, there will be residual material comprising dopant still present on the substrate of the object, so in the final step 1700, the residual material may be removed by any number of conventional cleaning processes. For some materials, such as semiconductor wafers, simply washing the wafer in clean water according to standard fab processes may be used. For other materials and other substrates, specialized solvents may be needed. The final result is a doped semiconductor wafer.

The doping profiles so manufactured can have fewer defects, and with calibrated use of the microwave frequency matched to the dopant resonance properties, the movement of the dopants within the substrate can be well controlled, leading to a desirable doping profile. This can lead to better electrical properties of semiconductors, such as sheet and contact resistance, and better defined barrier structures, which can lead to better properties and reliability in the areas of drive current, off-state leakage punch-through behavior, and hot carrier reliability.

II. Experimental Example

Early experimental results for a system constructed according to an embodiment of the invention have confirmed the beneficial properties of doping in this manner.

For this experiment, boron was doped into silicon. The object to be exposed was a sample of a standard planar silicon wafer a few cm$^2$ in area, upon which a 50 μm thick layer of boron oxide, had been deposited from a water colloidal solution in water and subsequent drying.

The experimental system components for this demonstration were:
1) A 60 kW gyrotron was use as a 60 GHz microwave source, and produced a continuous wave Gaussian microwave beam;
2) An optical system comprising a single reflective optical element that focused the microwaves to a spot size of 2 cm; with the focused beam aligned to be perpendicular to the surface of the object to be exposed and to provide an electric field substantially parallel to the planar surface of the silicon, with the electric field in the range of 1 to 3 kV/cm; the optical system was additionally equipped with a stepper motor that allowed the translation of the beam position while keeping the beam perpendicular to the silicon;
3) The microwave exposure chamber was filled with nitrogen at atmospheric pressure;
4) The microwave exposure chamber was equipped with a stage with motion allowed in one dimension, governed by a stepper motor and controller, and was designed to hold a silicon wafer facing the microwave beam as focused by the optical system;
5) The microwave exposure chamber also was provided with a source of nitrogen cooling gas at a flow rate sufficient to keep object temperature below 750° C., and which was directed to flow onto the area where the microwave exposure occurred;
6) The microwave chamber was also provided with a pyrometer, in this case, an M90 from Mikron Infrared Inc., positioned outside the chamber and aimed to monitor the temperature of the silicon object while exposure was taking place, and linked in a feedback loop with the gyrotron power management to guarantee a maximum temperature of 750° C. was not exceeded during 5 second exposures on the object surface.

To execute this process, the following steps were carried out:
1) The object (silicon coated with boron oxide) was placed in the chamber and aligned with the dopant coated side of the silicon facing the optical system;
2) The chamber was closed and purged with nitrogen gas at ambient pressure for at least 10 minutes; the gas flow was maintained through both microwave exposures;
3) The gyrotron was turned on for an exposure of 60 GHz microwaves with a delivered power of about 5 kW, as measured at the object, for approximately 5 seconds;
4) After this, the gyrotron power (still at 60 GHz) was increased to a with a delivered power of about 7 kW, as measured at the object, for approximately 1 to 1.5 seconds;
5) And, once the exposures were complete, the gas flow was shut off, the object removed from the chamber, and then washed with clean water to remove the residual boron oxide on the surface.

Confirmation of the success of the doping was carried out using two measurements: a sheet resistances/spreading resistance profile measurement, and secondary ion mass spectroscopy (SIMS) on the processed object. These allow determination of electrical junction depth and active carrier concentration profiles, and metallurgical junction depth respectively.

A four-point probe (Jandel Model RM-2) was used for the preliminary sheet resistance measurements of the processed semiconductor surface. The sheet resistance before processing was too high to be measured with the probe. However, after processing, the sheet resistance R was measured to be around 300 Ω/sq. This is an initial indication of successful processing.

Figure 5:
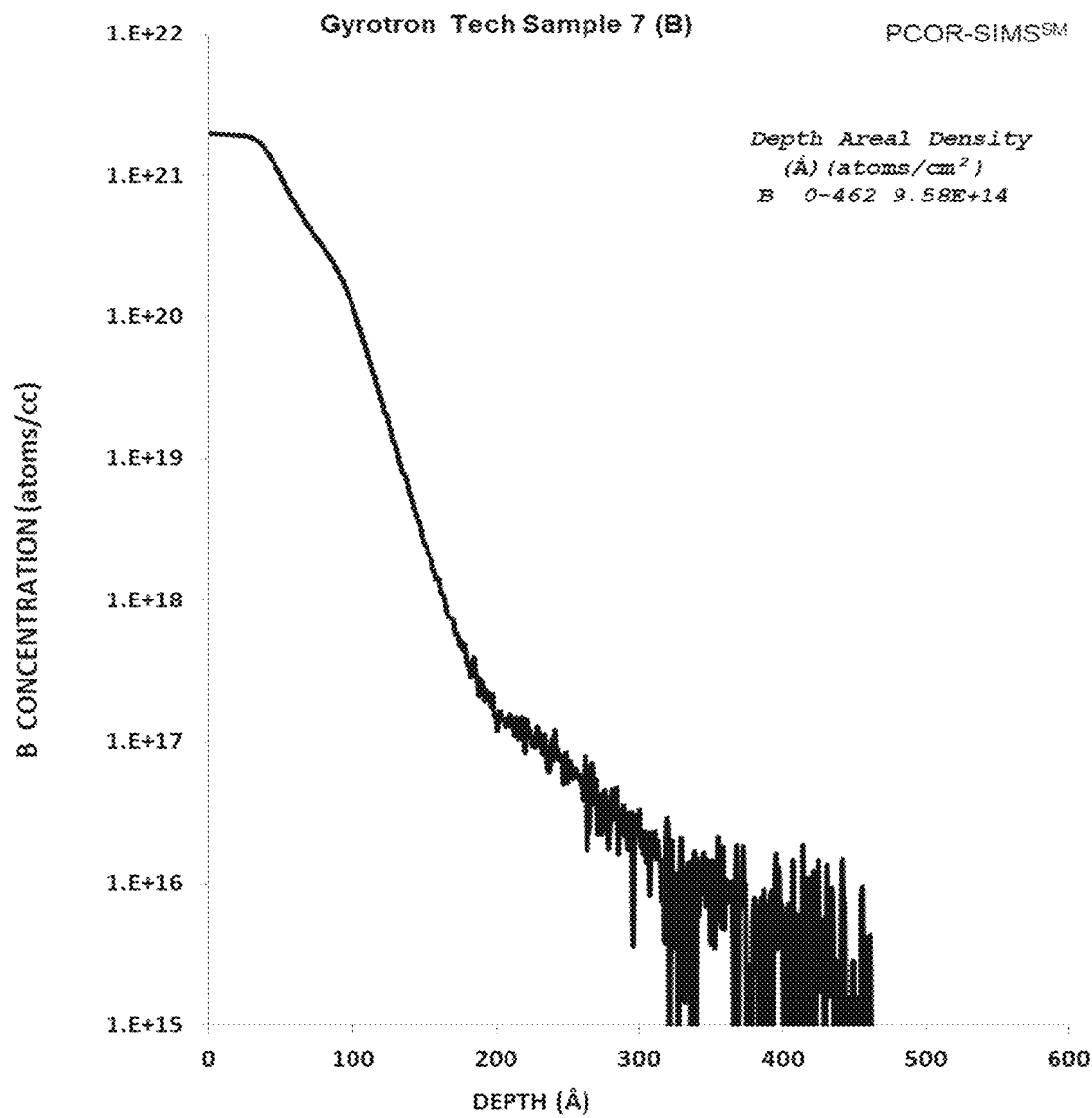
FIG. 5 illustrates a plot of experimental result of a boron profile, plotting concentration vs. depth from the surface of the substrate, after being treated using an embodiment of the invention.

A plot of the experimental results for an active dopant depth profile for the processed object measured using SIMS is shown in FIG. 5. The comparatively shallow junction depth (active carrier concentration profiles) measured on the level of $10^{18}$/cm$^2$ was achieved. Therefore, an efficient activation has occurred, without traditional annealing for eliminating defects.

III. Variations

In some embodiments, the microwave exposure dose is selected so that the dopant material melts, to facilitate the transition of dopant atoms into the substrate.

In some embodiments of the invention, the microwave beam has a Gaussian intensity profile. The use of a Gaussian profile, when scanned over the surface (or, in the embodiment as illustrated in FIG. 3, when the surface is scanned underneath the microwave beam) can facilitate a more uniform heating over a larger area.

In some embodiments of the invention, at least some portions of the surface of the object to be exposed may be exposed more than one time.

In some embodiments, the beam is held in a fixed position, and the stage holding the object to be exposed is scanned underneath the beam. In some embodiments, the object to be exposed is held in a fixed position, and adjustments are made to the microwave optical system to scan the beam over the surface of the object. In some embodiments, the adjustments to the optical system may be made so that the beam position is changed, but the direction of propagation remains perpendicular to the plane of the planar object to be exposed. This allows the direction of the electric field to be parallel to the plane of the object, which is especially preferred if the object is a planar semiconductor wafer.

In some embodiments, when the beam is scanned, the microwave beam may no longer be perpendicular to the surface of the object, and therefore the E-field orientation may no longer be exactly parallel to the surface. However, with small deviations of ±5 degrees, effective results can still be achieved. In some scanning beam embodiments, the wafer may remain stationary, but be tilted as the beam is scanned to compensate for the changing angle of the microwave beam. In some circumstances, exposure doses may also need to be compensated for the varying angles of exposure and therefore changing exposure density. Use of a pyrometer in a closed feedback loop to manage exposure conditions may help ensure a predetermined temperature during exposure is achieved and maintained.

In some embodiments of the invention, the microwave beam can be operated in a pulsed mode. The intermittent exposures allow some heat transfer away from the substrate between pulses. Microwave pulses can be easily made by controlling one of the voltage applied to the gyrotron. The pulse profile is almost rectangular, with pulse duration of ~1-2 second, and a duty cycle of 20-40%

The experimental process above has been described above as a two step process, in which the first set of exposure conditions excites the dopant and stimulates dopant diffusion into the lattice, and the second set of exposure conditions allows the dopants to settle into substitutional positions within the crystal lattice. However, in some embodiments, with some dopants under some conditions, the desired end goal of having dopants substituted into the crystal lattice may be achieved using only one set of exposure conditions. In such a case, the same method in principle may be followed, but with the second exposure simply having an exposure of 0 W/cm², or an exposure for a duration of 0 seconds.

In some embodiments, the exposure times and conditions for the first and second steps may be predetermined through a process of trial and error, with measurements made at intermediate points in the exposures to determine how the doping has progressed.

In some embodiments, a multi-step process having more than two sets of exposure times and conditions may be used. The exposure times and conditions for these multiple steps may be selected depending on the response and mobility of the dopants into the particular substrate being doped. The presence of cooling gases, and their compositions, pressures, and flow rates, may also be varied for the different steps of a multi-step process.

With this Application, several embodiments of the invention, including the best mode contemplated by the inventors, have been disclosed. This disclosure is intended to disclose how to fashion and use various embodiments in accordance with the invention rather than to limit the true, intended, and fair scope and spirit thereof. The foregoing description is not intended to be exhaustive, or to limit the invention to the precise form disclosed.

It will be recognized that, while specific embodiments may be presented, modifications or variations are possible in light of the above teachings, and elements discussed in detail only for some embodiments may also be applied to others. The embodiment(s) were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

While specific materials, designs, configurations and fabrication steps have been set forth to describe this invention and the preferred embodiments, such descriptions are not intended to be limiting. Modifications and changes may be apparent to those skilled in the art, and it is intended that this invention be limited only by the scope of the appended claims.

What is claimed is:

1. A method for doping semiconductor materials, comprising:
   placing a object to be doped on a positioning stage, wherein
      the object has a substantially planar region comprising a semiconductor material, and wherein
      the object additionally has a material comprising a dopant
         in contact with at least a portion of the planar region;
   selecting a microwave frequency for microwave radiation from a microwave source to match a microwave resonance absorption of the dopant;
   exposing a portion of the object to a first predetermined power density of the microwave radiation for a first predetermined time, wherein
   the microwave radiation electric field is oriented within ±5 degrees of parallel to the plane of the planar region; and
   removing any remaining material comprising dopant still in contact with the at least a portion of the semiconductor material.

2. The method of claim 1, wherein
the microwave source is a gyrotron; and
the microwave frequency is greater than 28 GHz and less than 250 GHz.

3. The method of claim 2, wherein
the microwave radiation has a Gaussian intensity profile.

4. The method of claim 2, wherein
the microwave radiation is pulsed in time.

5. The method of claim 1, wherein
the positioning stage is provided with a chamber for which atmospheric conditions can be adjusted; and wherein
placing the object on the positioning stage comprises placing the object on a mount within the chamber; and wherein
exposing a portion of the object to microwave radiation occurs with the object positioned on the mount within the chamber after the atmospheric conditions have been set.

6. The method of claim 5, wherein
the mount comprises a heat sink configured to draw heat away from the object during exposure to microwaves.

7. The method of claim 5, wherein
the atmospheric conditions comprise
filling the chamber with a gas at a predetermined pressure, the gas comprising at least one of: air, nitrogen, carbon dioxide, helium, neon, or argon.

8. The method of claim 7, wherein
the predetermined pressure is 1 bar±10%.

9. The method of claim 7, wherein
the predetermined pressure is between 20 bar and 50 bar.

10. The method of claim 5, wherein
the atmospheric conditions comprise
a vacuum of less than 1 millibar within the chamber.

11. The method of claim 5, wherein
the chamber is additionally provided with a gas delivery system;
and additionally comprising:
flowing a cooling gas from the gas delivery system to the surface of the object as the object is exposed to microwave radiation.

12. The method of claim 11, wherein
the cooling gas comprises at least one of:
air, nitrogen, carbon dioxide, helium, neon, or argon.

13. The method of claim 1, wherein
the positioning stage is configured to move while the object is exposed to the microwave radiation.

14. The method of claim 13, additionally comprising:
coordination by a controller configured to control
motions of the positioning stage and
exposure conditions for the microwave radiation.

15. The method of claim 1, additionally comprising:
detecting temperature for the object using a pyrometer while exposing the object to microwave radiation.

16. The method of claim 1, additionally comprising:
after exposing the portion of the object to the first predetermined power density of the microwave radiation for the first predetermined time, exposing the portion of the object to a second predetermined power density of the microwave radiation for a second predetermined time.

17. The method of claim 1, wherein:
the semiconductor material comprises at least one of:
silicon, germanium, silicon carbide, gallium nitride, gallium arsenide, indium gallium nitride, cadmium telluride, or cadmium sulfide.

18. The method of claim 1, wherein:
the material comprising the dopant comprises at least one of:
boron, gallium, magnesium, indium, phosphorous, arsenic, antimony, bismuth, or lithium.

19. A method for doping semiconductor materials, comprising:
placing a object to be doped on a mount in a chamber on a positioning stage, wherein
the object has a substantially planar region comprising a semiconductor material, and wherein
the object additionally has a material comprising a dopant
in contact with at least a portion of the planar region, and wherein atmospheric conditions within the chamber can be adjusted;
setting the atmospheric conditions within the chamber to predetermined parameters;
selecting a microwave frequency for microwave radiation from a gyrotron
to match a microwave resonance absorption of the dopant;
exposing a portion of the object to a first predetermined power density of the microwave radiation for a first predetermined time, and
exposing the portion of the object to a second predetermined power density of the microwave radiation for a second predetermined time; wherein
the microwave radiation electric field for both the first exposure and
the second exposure is oriented within ±5 degrees of parallel to the plane of the planar region;
flowing a cooling gas from a gas delivery system to the surface of the object as the object is exposed to microwave radiation;
removing the object from the chamber; and
removing any remaining material comprising dopant still in contact with the at least a portion of the semiconductor material.

20. The method of claim 19, wherein
the semiconductor material is silicon,
the object is a silicon wafer,
the material comprising a dopant is boron oxide,
the dopant is boron,
the cooling gas is nitrogen,
the microwave frequency is 60 GHz,
the first exposure is for approximately 5 seconds, with a power of 5 kW delivered to a focused spot 2 cm in diameter, and
the second exposure is for approximately 1 second, with a power of 7 kW delivered to a focused spot 2 cm in diameter.

\* \* \* \* \*